United States Patent [19]
Ito et al.

[11] Patent Number: 4,935,804
[45] Date of Patent: Jun. 19, 1990

[54] SEMICONDUCTOR DEVICE

[75] Inventors: Takashi Ito, Kawasaki; Hiroshi Horie, Ebina; Toshihiro Sugii, Kawasaki, all of Japan

[73] Assignee: Fujitsu Limited, Kanagawa, Japan

[21] Appl. No.: 168,589

[22] Filed: Mar. 3, 1988

Related U.S. Application Data

[63] Continuation of Ser. No. 713,210, Mar. 18, 1985, abandoned.

[30] Foreign Application Priority Data

Mar. 19, 1984 [JP] Japan ............................. 59-051205

[51] Int. Cl.$^5$ ............................................ H01L 23/48
[52] U.S. Cl. ......................................... 357/71; 357/6; 357/23.1; 357/59
[58] Field of Search ................... 357/6, 15, 23, 54, 59, 357/71

[56] References Cited

U.S. PATENT DOCUMENTS

| | | | |
|---|---|---|---|
| 3,755,026 | 8/1973 | Reynolds | 357/6 |
| 4,117,506 | 9/1978 | Carlson et al. | 357/6 |
| 4,141,022 | 2/1979 | Sigg et al. | |
| 4,377,857 | 3/1983 | Tickle | 357/23.5 |
| 4,460,980 | 7/1984 | Hagiwara et al. | 357/23.5 |
| 4,558,344 | 12/1985 | Perlegos | 357/23.5 |

OTHER PUBLICATIONS

IBM—Tech. Disc. Bul.—Reith—vol. 22, No 2, Jul. 1979.
IBM—Tech. Dis. Bul.—vol. 13, No. 6, Nov. 1970, Abbas et al., p. 1428.
Patent Abstracts of Japan, vol. 6, No. 251, 10th Dec. 1982, p. (E-147) (1129); & JP-A-57-149751 (Nippon Denki) 16-09-1982.
IBM Technical Disclosure Bulletin, vol. 22, No. 2, Jul. 1979, New York, USA; T. M. Reith "Diffusion Barrier Process", p. 558.
Applied Physics Letters, vol. 32, No. 5, 1st Mar. 1978, New York, USA; T. Ito "Thermally Grown Silicon Nitride Films for High-Performance MNS Devices", pp. 330–331.

*Primary Examiner*—Edward J. Wojciechowicz
*Attorney, Agent, or Firm*—Armstrong, Nikaido, Marmelstein, Kubovcik & Murray

[57] ABSTRACT

A semiconductor device with an electrode wiring layer including an upper conductive layer and, interspaced with a barrier layer used for reaction prevention, a lower conductive layer contacting an active region. The barrier layer consists of an insulating film having a thickness thin enough for flow of a tunnel current.

7 Claims, 8 Drawing Sheets

MTP GATE

POLY SiGATE $T_{ox} = 25$ nm   $L_{eff} = 1.3 \mu m$   $W_{eff} = 10 \mu m$

I-V CHARACTERISTICS

SEMICONDUCTOR DEVICE

This is a continuation of application Ser. No. 713,210, filed Mar. 18, 1985 now abandoned.

BACKGROUND OF THE INVENTION

1. Field of the Invention

The present invention relates to a semiconductor device, more particularly to a new structure of an electrode or wiring having two layers formed by a layer of a polycrystalline silicon and a layer of a high melting point metal or silicide thereof.

2. Description of the Related Art

Polycrystalline silicon is often used as the material of electrodes or wiring in the production of a semiconductor device, particularly, an integrated circuit (IC). Since polycrystalline silicon is a semiconductor, it has a high resistivity compared to a metal. To lower the resistivity impurities of phosphorous, arsenic, boron, or the like are doped in the polycrystalline silicon. These have not, however, managed to reduce the resistivity to the desired level. The still high resistivity of the polycrystalline silicon therefore causes delays in signal propagation.

Recently, to solve this problem, use has been made of a high melting point metal, for example, molybdenum or tungsten, or a silicide thereof. Materials such as molybdenum or tungsten however, are not very suited to production processes of semiconductor devices such as IC's. For example, when molybdenum or tungsten is deposited on a thin silicon dioxide film and heat-treated at a high temperature, the high melting point metal locally reacts with the silicon dioxide and significantly reduces the breakdown voltage of the silicon dioxide film. Further, when a high concentration doped semiconductor contacts molybdenum or tungsten, the contact resistance is remarkably increased.

Unexamined Patent Publication (Kokai) No. 56-79450 (filed on Dec. 30, 1979) discloses an electrode or wiring in a semiconductor device formed by placing or burying molybdenum or tungsten at a part of the polycrystalline silicon layer, but the electrode or wiring suffer from the same problems as mentioned above.

SUMMARY OF THE INVENTION

An object of the present invention is to eliminate the above-mentioned problems.

Another object of the present invention is to provide a semiconductor device having improved signal propagation.

Still another object of the present invention is to provide a semiconductor device wherein an electrode or wiring has a low contact resistance at the interface with the polycrystalline silicon film.

To attain the above objects, there is provided a semiconductor device including an electrode wiring layer consisting of an upper conductive layer and, interspaced with a barrier layer used for reaction prevention, a lower conductive layer contacting an active region. The barrier layer consists of an insulating film having a thickness thin enough for the flow of a tunnel current.

DESCRIPTION OF THE PREFERRED EMBODIMENTS

Embodiments of the present invention will now be described with reference to the drawings.

FIGS. 1 to 4 are cross-sectional views of a production process for an embodiment according to the present invention.

The embodiment is described using a metal-insulator-semiconductor (MIS) field-effect-semiconductor device.

Figure 1:
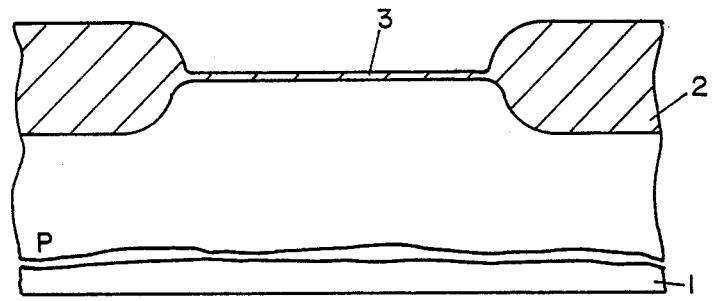
FIGS. 1 to 4 are cross-sectional views of a production process for a semiconductor device of an embodiment according to the present invention.

As shown in FIG. 1, a p-type silicon semiconductor substrate 1 has formed thereon a field insulating film 2 consisting of silicon dioxide by a selective thermal oxidation process. A gate insulating film 3 is formed by a thermal oxidation process on the surface of an active region of the substrate 1.

Figure 2:
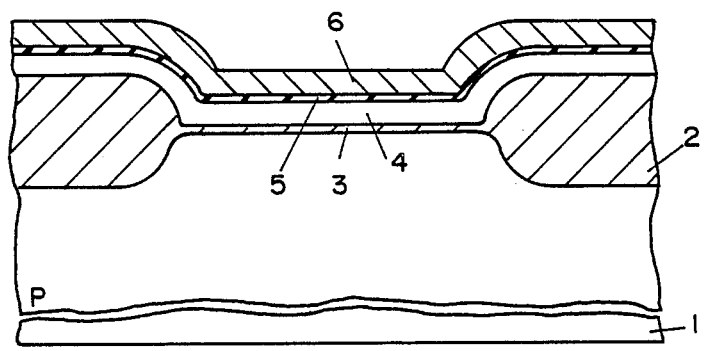

As shown in FIG. 2, a polycrystalline silicon film 4 having a thickness of about 0.1 μm is formed by a chemical vapor deposition (CVD) process. Phosphorus ions are doped in a high concentration, for example, $10^{20}/cm^3$ or more, into the polycrystalline silicon film 4 by a vapor diffusion process, ion implanting process, or the like.

The surface of the polycrystalline silicon film 4 then has formed thereon a silicon nitride film 5 having a thickness of about 20 Å by heat treatment for five minutes at a temperature of 700° C. in an atmosphere of pure ammonia gas.

The silicon nitride film 5 may also be formed by a CVD process using, for example, mono-silane ($SiH_4$) and ammonia ($NH_3$) gas or by a nitriding process using energy of ammonia plasma or light irradiation.

The thickness of the silicon nitride film 5 may be from 10 to 50 Å, allowing the flow of a tunnel current through application of voltage to the silicon nitride film 5 during operation of the semiconductor device.

The silicon nitride film 5 has formed on it, for example, a molybdenum film having a thickness of about 0.3 μm by a well known sputtering process or CVD process. After that, heat treatment is carried out at a temperature of, for example, about 1000° C. to increase the density of the molybdenum film 6 and thus reduce the resistivity of the molybdenum.

During the heat treatment, the silicon nitride film 5 acts as a barrier preventing the polycrystalline silicon film 4 from reacting with the molybdenum film 6, thereby maintaining the low resistivity.

When no silicon nitride film 5 is formed between the polycrystalline silicon film 4 and the molybdenum film 6, molybdenum reacts with the polycrystalline silicon to form molybdenum silicide. Molybdenum has a sheet resistivity of 0.3 $\phi/\Box$, while molybdenum silicide has a sheet resistivity of 3 $\phi/\Box$. Since impurities doped into the polycrystalline silicon film 4 are not absorbed into the molybdenum film 6 due to the presence of the silicon nitride film 5, the threshold voltage in a gate electrode of an MIS field-effect semiconductor device according to the present invention can be maintained at substantially the same level as in a conventional silicon gate of an MIS field-effect semiconductor device.

Figure 3:
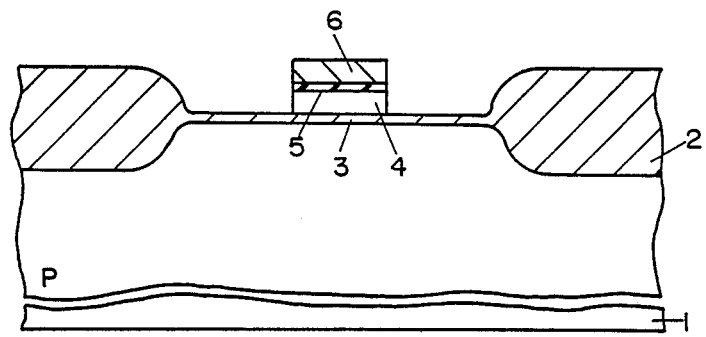

After forming the molybdenum film, as shown in FIG. 3, the molybdenum film 6, silicon nitride film 5, and the polycrystalline silicon film 4 are patterned by reactive ion etching using a usual lithographic technique to form a two-layer gate electrode consisting of a molybdenum film and a polycrystalline silicon film. After that, required wiring is formed as necessary.

Figure 4:
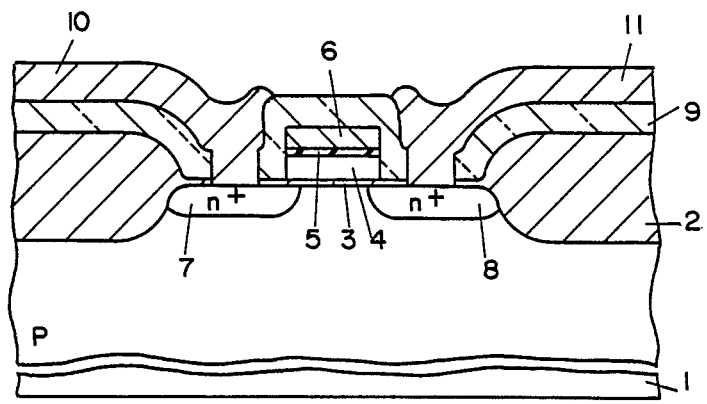

An shown in FIG. 4, arsenic ions (As+) are then injected into the obtained structure by ion implantation, while the ion implanted structure is heat-treated so that an n+type source region 7 and an n+type drain region 8 are formed in the p-type silicon semiconductor substrate 1.

A phospho-silicate glass (PSG) film 9 is formed on the obtained structure. The PSG film 9 is patterned by a usual lithographic technique to form electrode contact windows. Aluminum film is formed on the entire surface of the obtained structure by, for example, a spattering process. The aluminum is patterned by a usual lithographic technique to form a source electrode 10 and a drain electrode 11. Well-known techniques are applied to the thus obtained structure to form the MIS field effect semiconductor device.

Figure 5:
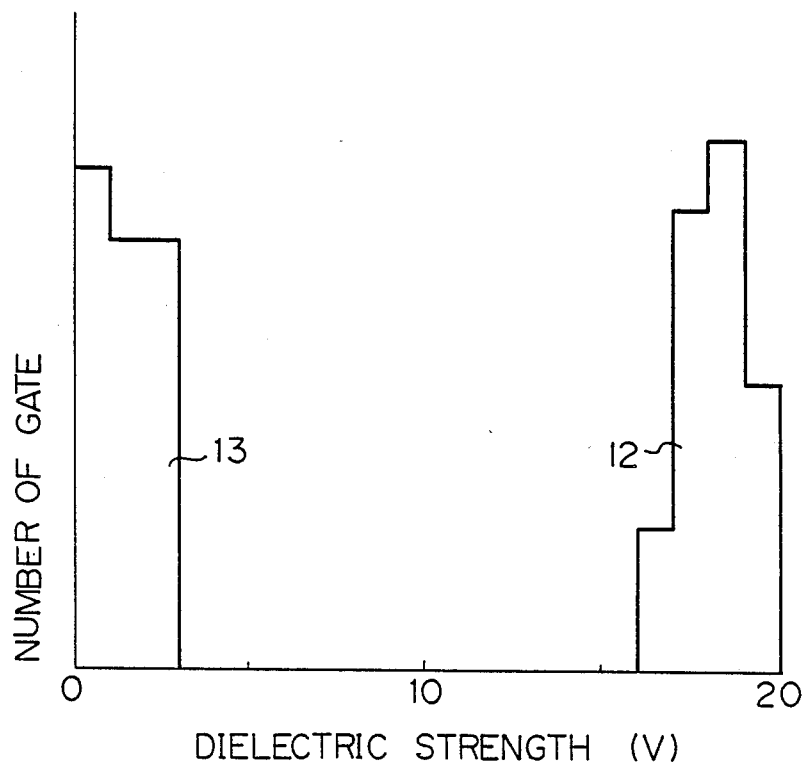
FIG. 5 is a histogram illustrating the dielectric strength between a gate electrode and a semiconductor substrate according to the present invention.

FIG. 5 is a histogram illustrating the dielectric strength between a gate electrode and a semiconductor substrate according to the present invention.

In FIG. 5, the region designated by reference numeral 12 relates to an MIS field-effect semiconductor device according to the present invention. In this case, the thickness of the gate insulating film 3 is 200 Å. The dielectric strength is 16 V to 20 V, which is a satisfactory value. The sheet resistivity of the two-layer gate electrode is about 0.5 $\phi/\Box$.

On the other hand, the region designated by reference numeral 13 relates to an MIS field-effect semiconductor device which has no silicon nitride film 5 between the polycrystalline silicon film 4 and the molybdenum film 6. In this case, the dielectric strength is remarkably decreased and the sheet resistance becomes about 5 $\phi/\Box$.

In the above embodiments, phosphorous ions were doped into the polycrystalline silicon. However, impurities such as boron ions or arsenic ions may also be used. Such impurities may be injected into the silicon substrate from above the molybdenum film 6 because the polycrystalline silicon film acts as a mask.

Further, in the above embodiments, molybdenum was used as the high melting point metal. However, other high melting point metals, such as molybdenum silicide or tungsten (W), chromium (Cr), titanium (Ti), zirconium (Zr), hafnium (Hf), platinum (Pt), palladium (Pd), nickel (Ni), cobalt (Co), iridium (Ir), tantalum (Ta), or silicides thereof may also be used.

Additionally, according to the present invention, a silicon nitride film acting as a barrier layer is placed between the polycrystalline silicon film and the film consisting of the high melting point metal or silicide thereof. However, the barrier layer is so thin that it has only a small effect on the electrical properties and allows a tunnel current to flow therein.

The electrical properties of the present invention are illustrated in FIGS. 6 to 9B.

Figure 6:
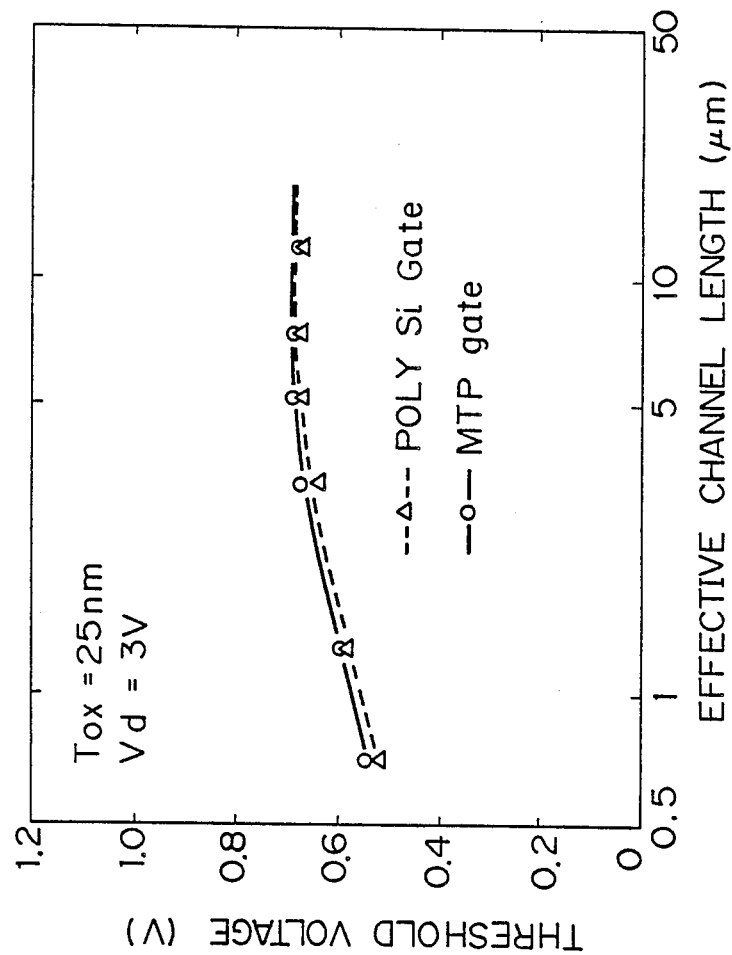
FIG. 6 is a graph illustrating the threshold voltage according to the present invention.

FIG. 6 is a graph illustrating the relationship between the threshold voltage and effective channel length.

In FIG. 6, "poly Si gate" shows prior art data, and "MTP gate" shows data of the present invention. "MTP" means "molybdenum tunnel nitride polycrystalline silicon".

As shown in FIG. 6, the threshold voltage of the present invention is substantially the same as that of the prior art. "Tox" means gate oxide. "Vd" means drain voltage.

Figure 7:
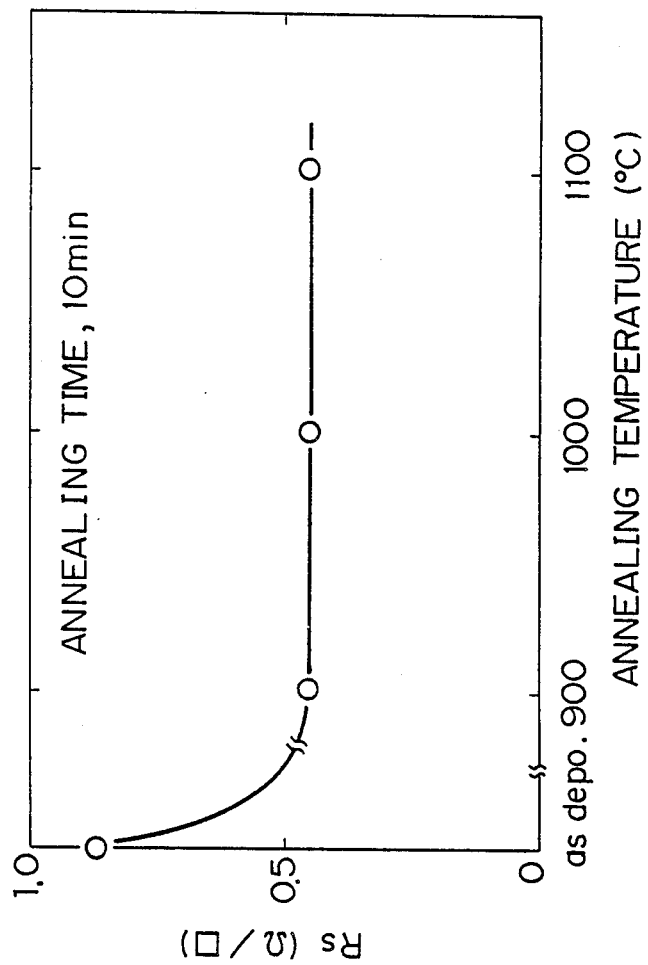
FIG. 7 is a graph illustrating the relationship between sheet resistivity and annealing temperature according to the present invention.

FIG. 7 is a graph illustrating the relationship between sheet resistance and annealing temperature according to the present invention. As shown in FIG. 7, the sheet resistance (Rs) is decreased as the annealing temperature is increased. Although the data is not illustrated in FIG. 7, the sheet resistance in the prior art is increased as the annealing temperature is increased, because of the reaction of the molybdenum or other metal with the silicon dioxide, as explained above.

Figure 8:
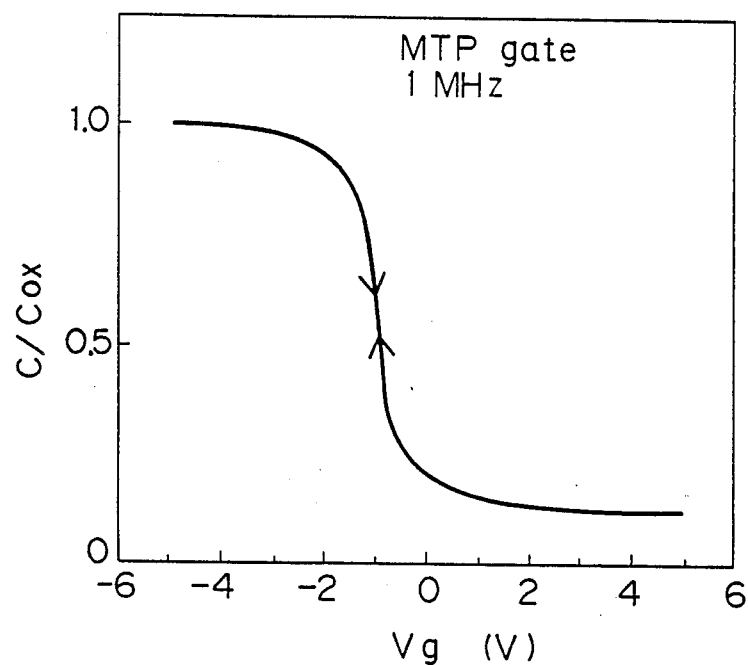
FIG. 8 is a graph illustrating the relationship between gate voltage and the ratio of capacitance of an oxide to capacitance of an MOS diode.

FIG. 8 is a graph illustrating the relationship between gate voltage (Vg) and the ratio ($C/C_{ox}$) of capacitance of oxide ($C_{ox}$) to the capacitance of the MOS diode according to the present invention. As shown in FIG. 8, the same curve is followed when the gate voltage is increased and the gate voltage is continuously decreased. Namely, no charge-up phenomenon can be seen between the polycrystalline silicon and molybdenum layers.

Figure 9B:
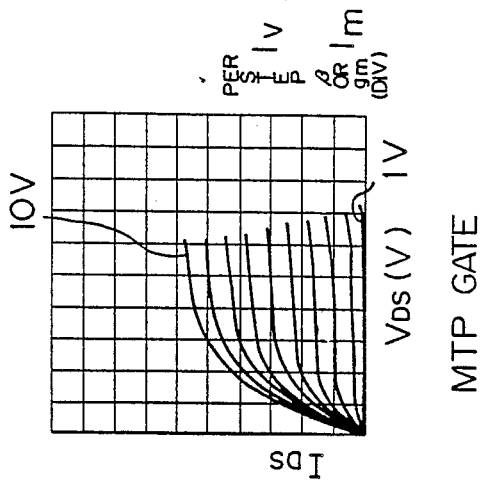
FIGS. 9A and 9B show I-V characteristics in a conventional polycrystalline silicon gate and in a gate according to the present invention, respectively.
Figure 9A:
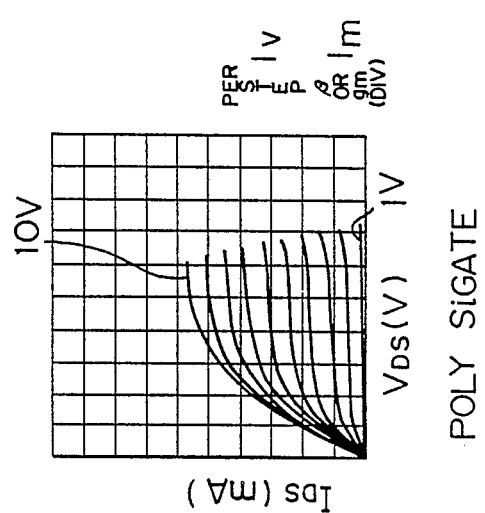

FIGS. 9A and 9B show I-V characteristics in a conventional polycrystalline silicon gate and in a gate (MTP) according to the present invention, respectively. As shown in FIGS. 9A and 9B, the I-V characteristics of the prior art and the present invention are substantially the same. The data in FIGS. 9A and 9B was obtained using a structure having a tunnel oxide thickness of 25 nm, effective channel length ($L_{eff}$) of 1.3 μm, and effective channel width ($W_{eff}$) of 10 μm.

Figure 10:
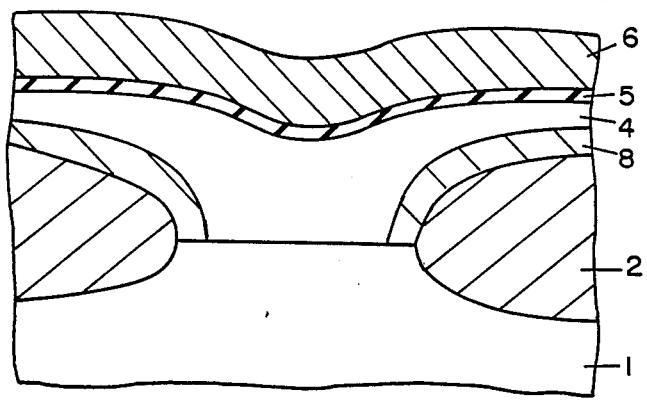
FIG. 10 is a cross-sectional view illustrating an ohmic contact electrode.
Figure 11:
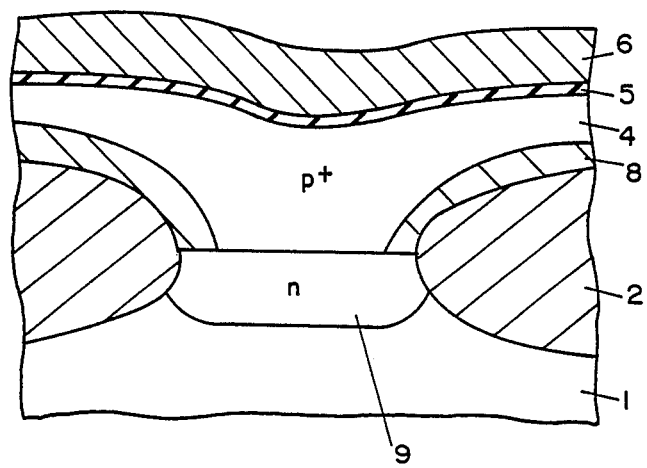
FIG. 11 is a cross-sectional view illustrating a rectifying contact electrode.

The present invention is preferably used for an ohmic contact electrode as shown in FIG. 10 and a rectifying contact electrode as shown in FIG. 11.

In FIG. 10, the polycrystalline silicon film 4 is contacted with the silicon substrate in ohmic contact.

In FIG. 11, the polycrystalline silicon film 4 doped, for example, with p+type impurities is contacted with the silicon substrate 1 having, for example, n region 9 in rectifying contact.

We claim:

1. A semiconductor device comprising:
   a substrate;
   an active region formed on said substrate; and
   a multi-layer electrode wiring layer formed on said active region, said multi-layer electrode wiring layer including,
   a lower conductive layer contacting said active region,
   an upper conductive layer, said upper and lower conductive layers having same plane patterns and together form said multi-layer electrode wiring while coextending over the substrate, and
   a barrier layer disposed between said upper conductive layer and said lower conductive layer, said barrier layer being used for reaction prevention between said upper conductive layer and said lower conductive layer, said barrier layer being of an insulating film having a thickness thin enough for flow of a tunnel current to maintain said lower and upper conductive layers at a substantially same potential.

2. A semiconductor device according to claim 1, wherein said active region is a gate insulating film region in a gate portion of an MIS semiconductor device.

3. A semiconductor device according to claim 1, wherein said barrier layer consists of a silicon nitride film.

4. A semiconductor device according to claim 1, wherein said lower conductive layer consists of polycrystalline silicon and said upper conductive layer consists of a high melting point metal or a silicide thereof.

5. A semiconductor device according to claim 4, wherein said barrier layer comprises a direct nitride film of the lower conductive layer surface consisting of the polycrystalline silicon.

6. A semiconductor device according to claim 1, wherein said active region consists of a semiconductor region on which an ohmic electrode is arranged and said lower conductive layer is in ohmic contact with the active layer.

7. A semiconductor device according to claim 1, wherein said active region consists of a semiconductor region on which a rectifying electrode is arranged and said lower conductive layer is in rectifying contact with the active region.

* * * * *